United States Patent [19]

Stitt et al.

[11] 4,438,338

[45] Mar. 20, 1984

[54] LOW PROFILE OPTICAL COUPLING FOR AN OPTOELECTRONIC MODULE

[75] Inventors: Robert M. Stitt; Neil P. Albaugh, both of Tucson, Ariz.

[73] Assignee: Burr-Brown Corporation, Tucson, Ariz.

[21] Appl. No.: 318,475

[22] Filed: Nov. 5, 1981

[51] Int. Cl.³ ............................................. G02F 1/28
[52] U.S. Cl. ................................... 250/551; 250/239
[58] Field of Search .................... 250/551, 227, 239; 350/96.10

[56] References Cited

U.S. PATENT DOCUMENTS 3,822,384 7/1974 Chapron et al. .................... 250/551
4,054,801 10/1977 Breval et al. ........................ 250/551

Primary Examiner—William L. Sikes
Assistant Examiner—Darwin R. Hostetter
Attorney, Agent, or Firm—Harry M. Weiss

[57] ABSTRACT

Means and method is disclosed for achieving a low profile optical coupling to a module comprising an optoelectronic device together with other circuitry. Maintaining the optoelectronic device parallel to the substrate on which it and the associated circuitry are mounted enables the use of standard, well known manufacturing assembly techniques while providing electrical connection to the electric ports of said optoelectronic device. Subsequent to the electrical interconnection operation, the optoelectronic device is moved, together with its connections, to a position substantially orthogonal with the mounting substrate. Optical fiber, light coupling is utilized. The low profile of the overall module package is achieved by introducing the optical fiber in a direction generally parallel with the substrate and perpendicular to the light active surface of the optic port of the optoelectronic device. The structure and method are applicable to both hybrid integrated circuit assembly technology as well as to conventional metallic lead frames for plastic encapsulation.

7 Claims, 4 Drawing Figures

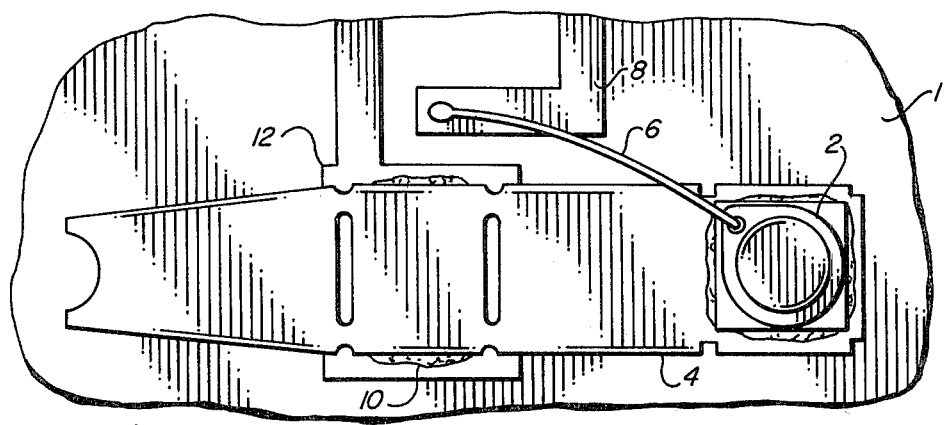
FIG-1
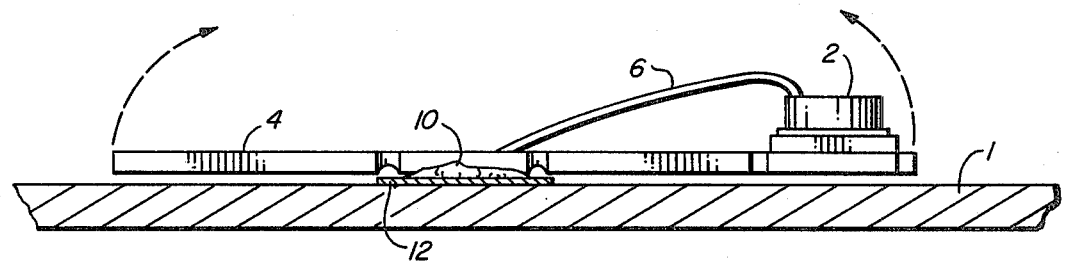
FIG-2
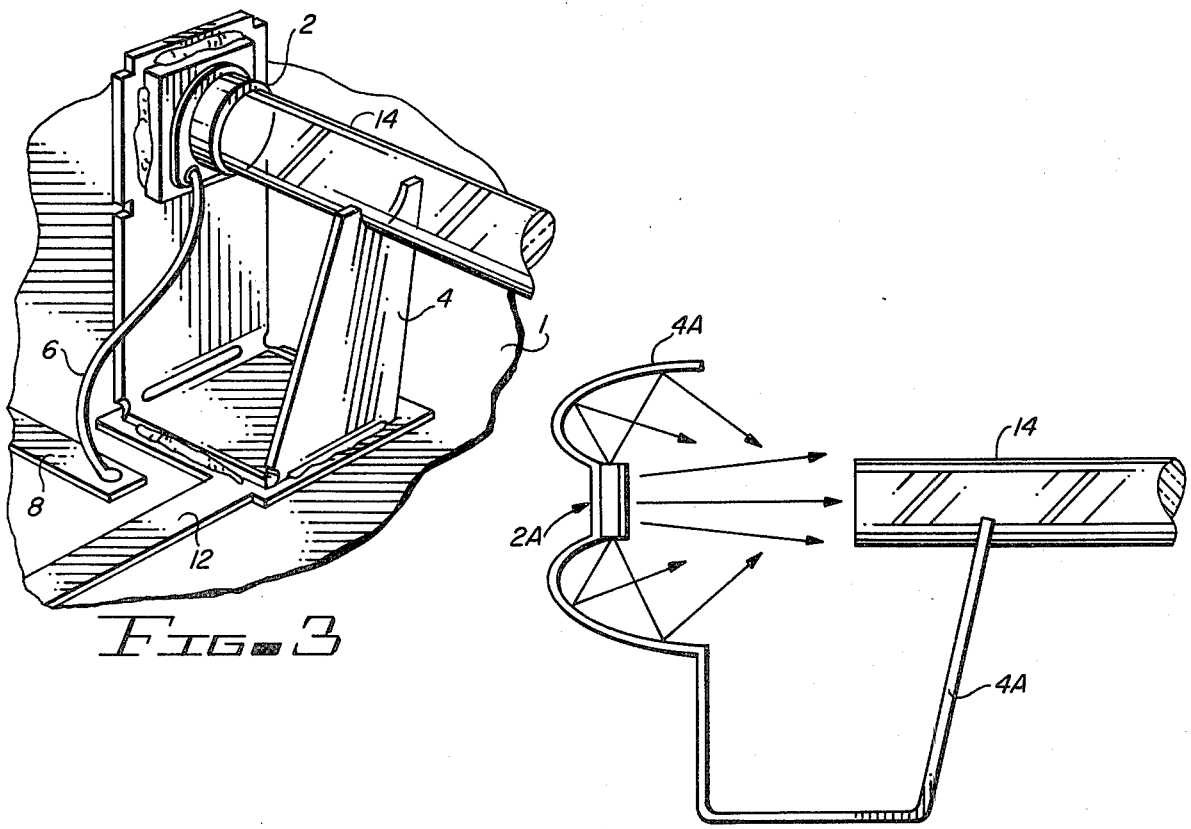
FIG-3
FIG-4

LOW PROFILE OPTICAL COUPLING FOR AN OPTOELECTRONIC MODULE

BACKGROUND OF THE INVENTION

1. Field of the Invention

The invention relates generally to optoelectronic devices, method and means for optically coupling thereto.

More particularly, the invention relates to a low profile silhouette package of an optoelectronic device and an associated optical coupler.

Even more specifically, the invention relates to a planar-mounted semiconductor signal processing device having an optoelectronic device mounted generally planar thereto for assembly and then moved to a position substantially orthogonal to said substrate to provide a module package to which an optical light fiber is introduced on a line essential parallel with said planar substrate.

2. Description of the Prior Art

An optoelectronic device is an electronic device combining both optic and electric ports. Such a device may be either a light receiver, such as a photodiode, or a light transmitter, such as a light-emitting diode (LED). Frequently, it is desirable to utilize such a device as a discrete component of a hybrid circuit assembly, especially where such optoelectronic device is an LED not now able to be fabricated in monolithic form with signal processing elements.

In general, the prior art provides two methods for providing light coupling to an optoelectronic module. In the first of these, the optoelectronic device is generally planar with the substrate of the associated circuitry. Where the planar situs is employed, conventional production techniques may be utilized to provide the necessary electric connections to the electric ports of the optoelectronic device. Light coupling means, most frequently in the form of light conducting fibers, are introduced to the optoelectronic module at an angle substantially normal to the substrate plane in which the optoelectronic device lies. The light fiber is supported in an optical fiber connector and the overall assembly of optical connector and module package is somewhat reminiscent of the outline of a single story factory building having a tall smokestack rising upwards from its roof structure.

To reduce the profile of the silhouette of the optoelectronic device package, a second approach to introducing optical coupling is employed. With this alternate approach, the optoelectronic device is a discrete component mounted on a dielectric standoff above the substrate of the associated circuitry such that the plane of the optic ports of the optoelectronic device is generally perpendicular to the plane of the substrate. This configuration has distinct disadvantages in that standard production techniques for making connection to the electric ports of the optoelectronic device can no longer be utilized. Special manufacturing procedures must be devised and used to successfully produce a module of this type. However, this configuration permits the optical connector to introduce the optical fiber on a plane essentially parallel with the plane of the substrate, thus somewhat increasing the length of the package while still maintaining its low profile silhouette.

Prior art which relates to photodetector packaging and optical coupling systems may be found in U.S. Pat. Nos. 3,757,127; 4,112,308; and 4,136,357. None of this known prior art discloses apparatus or methods as disclosed herein for maintaining a low package silhouette when optically coupling to an optoelectronic module having internal electrical interconnects effected by conventional means.

SUMMARY OF THE INVENTION

Accordingly, it is an object of the present invention to provide an improved optoelectronic module utilizing fiber optics to provide light coupling, which module shall present a low profile silhouette.

It is a further object of this invention to provide a low profile package utilizing optical fiber light coupling means to an optoelectronic device, which device is substantially planar with the substrate of the associated circuitry at the time of electrical interconnection and substantially perpendicular to the substrate at the time of the optical interconnection.

It is a more specific objective of the invention to provide an improved optoelectronic module having integral support means for both the optoelectronic device and the fiber optical light coupling means to simplify manufacture and assembly of the fiber optical optoelectronic module.

DESCRIPTION OF THE PREFERRED EMBODIMENT

The invention provides a modular package which contains a substrate, on which is mounted either hybrid or integrated circuitry, together with an optoelectronic device mounted essentially planar with said circuitry on movable means which allow the optoelectronic device to assume a position substantially perpendicular to said substrate and the circuitry located on said substrate. The movement is carried out after electrical interconnection between the optoelectronic device and the circuitry and/or substrate. An optical fiber which provides light coupling to the optoelectronic device is supported in a plane substantially parallel to said substrate and perpendicular to the optoelectronic device itself. Where the movable means supporting the optoelectronic device is for example a bendable metal tab, such means may be provided with auxiliary or jig portions for supporting the optical fiber in the desired position with respect to the substrate and the optoelectronic device. The device itself may be either a photon receiving or photon emitting element.

The foregoing and other objects, features and advantages of this invention will be apparent from the following more particular description of the preferred embodiments of the invention as illustrated in the accompanying drawings.

BRIEF DESCRIPTION OF THE DRAWING

FIG. 1 is a top view of an optoelectronic device mounted parallel with a substrate and interconnected thereto by conventional means.

FIG. 2 is a side view of FIG. 1.

FIG. 3 illustrates the optoelectronic device in its perpendicular position after bending of its mounting tab, and further illustrates additional bent tab means for supporting the optical fiber.

FIG. 4 illustrates movable means for supporting the optoelectronic device in its perpendicular position, such means including reflector means for enhancing the optical efficiency of coupling.

FIGS. 1 and 2 are illustrative of an intermediate stage in the fabrication of the optoelectronic module. In these Figures, 1 is a substrate which preferably comprises metallic regions 8 to 12 which serve to provide electrical bonding sites to the optoelectronic device as well as to connect to signal processing circuitry (not shown) mounted on substrate 1. Metallic member 4 is affixed to bonding region 12 as by solder or conductive epoxy 10 or by welding or intermetallic bonding. Adjacent the bonded region 10 of member 4 there are provided relief regions so that the opposite extremities of member 4 may be bent upwards at a later stage of the fabrication sequence. Member 4 is preferably a bendable alloy such as half-hard brass. As shown, the right-hand extremity of member 4 provides a situs for the mounting of optoelectronic device 2, again as by solder or conductive epoxy. The optional left-hand extremity of member 4 contains a notch or hole which serves for subsequent alignment and support of an optical fiber for coupling to the optical port of optoelectronic device 2.

The first stage of the fabrication sequence concludes with the electrical attachment to the top portion of optoelectronic device 2. This is accomplished by conventional bonding at both extremities of conductor 6, which is ordinarily a fine wire. Similar conductive members (not shown) provide for interconnection of the signal processing circuitry to other bonding regions on the substrate 1. Thus both the optoelectronic device 2 and another device or devices mounted parallel with the substrate 1 may be electrically connected by the same substrate attachment method (e.g. conductor 10) and the same top surface attachment method, here illustrated as wire bonding.

The second major stage of the fabrication process is illustrated by a comparison of FIGS. 2 and 3. As shown by the dashed arrows in FIG. 2, the opposite extremities of mounting means 4 are moved to a position substantially orthogonal with substrate 1. Conductive means 6 has been attached to the bonding area 8 at a location approximately in line with the final portion of the extremity of mounting means 4 bearing the optoelectronic device 2. In this way, conductive means 6 withstands its translation by maintaining a relatively constant path length between its attachments so that they are not impaired. Any substantial deviation from a constant path length should be such that wire 6 is not put into tension during the movement thereof.

Where the optional left-hand extremity of the mounting means 4 in FIGS. 1 and 2 is provided, a notch or hole therein preferably serves as the support for the fiber-optical strand or pigtail 14 shown in FIG. 3. Moving the pigtail supporting section of mounting means 4 away from or toward electronic device 2 moves the pigtail up or down, while rotation of this section effects lateral alignment. After positioning, adhesive (e.g. epoxy) applied to the fiber-optical pigtail at its juncture with either or both the optoelectronic device 2 and the mounting means 4 serves to ensure excellent mechanical integrity. The module is completed by the addition of a protective package or encapsulation as by organics.

Other details may be added to the mounting means 4 for special functions. For example, as shown in FIG. 4, a shaped reflective portion may be incorporated into the optoelectronic die attach end of the mounting means 4A. Such a reflective portion serves to form side-emitted light from a light-emitting diode into the end of the fiber-optic pigtail to increase the optical coupling efficiency.

As an alternate to the preferred embodiment shown in FIGS. 1-3, substrate 1 and mounting means 4 may be integral, i.e. respective portions of a metallic lead frame strip. Such an embodiment is preferable when the optoelectronic device die and the associated signal processing circuitry die may have electrically-common die mount portions due to the specifics of the circuit or because isolation is provided in one or both of the devices. Where electrically allowable, a module configuration wherein the optoelectronic device is mounted on a bendable portion of a metallic mounting strip which also serves as a mounting situs for another die simplifies the construction while providing a low profile optoelectronic module having the advantages hereinbefore described.

While the invention has been particularly described and shown in reference to the preferred embodiments thereof, it will be understood by those skilled in the art that various changes in form and detail and omissions may be made therein without departing from the spirit and scope of the invention.

What is claimed is:

1. A fiber optic module comprising a substrate bearing conductive surface portions parallel to a first plane, an optical fiber, and an optoelectronic device located substantially orthogonal to said first plane comprising two electrodes and having a planar light-coupling surface portion coupled to said optical fiber;
   one of said conductive surface portions of said substrate being electrically connectable to a signal processing circuit mounted on said substrate;
   first flexible conductive means for providing an electrical connection to said one of said conductive surface portions;
   metal deformable device mounting means including a first portion substantially parallel with said first plane and a second movable portion substantially orthogonal to said first plane for providing optical alignment and mechanical support for and electrical contact to said optoelectronic device; and
   second flexible conductive means of the same type as said first flexible conductive means attached to one of said electrodes of said optoelectronic device for electrically coupling said electrode to one of said conductive surface portions, said second flexible conductive means being attached to said optoelectronic device when its planar light-coupling surface portion is substantially orthogonal to said first plane.

2. The module of claim 1, where said deformable mounting means is an integral portion of said substrate.

3. The module of claim 1 further comprising second deformable mounting means for supporting said fiber optic.

4. The module of claim 1, said deformable mounting means comprising a shaped reflective portion for enhancing the efficiency of said module.

5. The module of claim 1, said deformable mounting means further comprising a third portion substantially orthogonal to said substrate for aligning and supporting said optical fiber.

6. A method for assembling a fiber optic module including a substrate bearing conductive surface portions parallel with a first plane and an optoelectronic device having a planar light-coupling surface portion substantially orthogonal to said first plane, comprising the steps of:

mounting on said substrate a deformable member having device-bearing portion substantially parallel with said substrate;

mounting said device on said device-bearing portion of said member;

electrically connecting said light-coupling surface portion with one of said conductive surface portions on said substrate; and deforming said member to cause said device surface portion to assume a position substantially orthogonal to said first plane subsequent to said electrically connecting step.

7. The method of claim 6, further comprising electrically interconnecting other of said conductive portions along with said electrically connecting step.

* * * * *